(12) United States Patent
Ramaswamy (10) Patent No.: US 10,553,587 B2
(45) Date of Patent: Feb. 4, 2020

(54) ARRAY OF CROSS POINT MEMORY CELLS AND METHODS OF FORMING AN ARRAY OF CROSS POINT MEMORY CELLS

(71) Applicant: Micron Technology, Inc., Boise, ID (US)

(72) Inventor: Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/356,464

(22) Filed: Mar. 18, 2019

(65) Prior Publication Data

US 2019/0214390 A1 Jul. 11, 2019

Related U.S. Application Data

(62) Division of application No. 15/151,582, filed on May 11, 2016, now Pat. No. 10,269,804.

(51) Int. Cl.
*H01L 27/10* (2006.01)
*H01L 45/00* (2006.01)
*H01L 27/24* (2006.01)
*G11C 11/22* (2006.01)
*H01L 27/11502* (2017.01)

(52) U.S. Cl.
CPC ........ *H01L 27/101* (2013.01); *H01L 27/2409* (2013.01); *H01L 27/2463* (2013.01); *H01L 45/06* (2013.01); *H01L 45/1233* (2013.01); *H01L 45/141* (2013.01); *G11C 11/22* (2013.01); *G11C 2213/70* (2013.01); *H01L 27/11502* (2013.01)

(58) Field of Classification Search
CPC .......................... H01L 27/101; H01L 27/2463
See application file for complete search history.

(56) References Cited

U.S. PATENT DOCUMENTS

| 8,021,897 | B2 | 9/2011 | Sills et al. |
| 8,729,667 | B2 | 5/2014 | Kuniya |
| 9,704,802 | B2 | 7/2017 | Liu |
| 2002/0017671 | A1* | 2/2002 | Goebel ............ H01L 27/10841 257/301 |
| 2006/0208297 | A1 | 9/2006 | Isenberger |
| 2010/0283155 | A1 | 11/2010 | Tang et al. |

(Continued)

FOREIGN PATENT DOCUMENTS

| JP | 2013-149921 | 8/2013 |
| KR | 10-2011-0118676 | 10/2011 |

(Continued)

*Primary Examiner* — Raj R Gupta
(74) *Attorney, Agent, or Firm* — Wells St. John P.S.

(57) ABSTRACT

A method of forming an array of cross point memory cells comprises using two, and only two, masking steps to collectively pattern within the array spaced lower first lines, spaced upper second lines which cross the first lines, and individual programmable devices between the first lines and the second lines where such cross that have an upwardly open generally U-shape vertical cross-section of programmable material laterally between immediately adjacent of the first lines beneath individual of the upper second lines. Arrays of cross point memory cells independent of method of manufacture are disclosed.

12 Claims, 13 Drawing Sheets

(56) References Cited

U.S. PATENT DOCUMENTS

| | | |
|---|---|---|
| 2011/0032753 A1* | 2/2011 | An .................. G11C 11/56 365/163 |
| 2011/0299328 A1 | 12/2011 | Liu |
| 2012/0068143 A1 | 3/2012 | Smythe et al. |
| 2012/0104343 A1 | 5/2012 | Ramaswamy et al. |
| 2013/0320288 A1 | 12/2013 | Redaelli et al. |
| 2014/0117302 A1 | 5/2014 | Goswami |
| 2014/0291604 A1 | 10/2014 | Pellizzer et al. |
| 2015/0028283 A1 | 1/2015 | Redaelli et al. |
| 2015/0280117 A1 | 10/2015 | Boniardi et al. |
| 2015/0349255 A1 | 12/2015 | Pellizzer et al. |
| 2015/0364565 A1 | 12/2015 | Ramaswamy et al. |

FOREIGN PATENT DOCUMENTS

| | | |
|---|---|---|
| WO | WO 2010/096225 | 10/2010 |
| WO | WO PCT/US2017/031872 | 7/2017 |
| WO | WO PCT/US2017/031872 | 11/2018 |

* cited by examiner

FIG. 13

ARRAY OF CROSS POINT MEMORY CELLS AND METHODS OF FORMING AN ARRAY OF CROSS POINT MEMORY CELLS

RELATED PATENT DATA

This patent resulted from a divisional application of U.S. patent application Ser. No. 15/151,582, filed May 11, 2016, entitled "Array Of Cross Point Memory Cells And Methods Of Forming An Array Of Cross Point Memory Cells", naming Durai Vishak Nirmal Ramaswamy as inventor, the disclosures of which are incorporated by reference.

TECHNICAL FIELD

Embodiments disclosed herein pertain to arrays of cross point memory cells and to methods of forming an array of cross point memory cells.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. One type of capacitor is a ferroelectric capacitor which has ferroelectric material as at least part of the insulating material. Ferroelectric materials are characterized by having two stable polarized states and thereby can comprise programmable material of a memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state reverses the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. One type of memory cell has a select device electrically coupled in series with a ferroelectric capacitor.

Another type of non-volatile memory is phase change memory. Such memory uses a reversibly programmable material that has the property of switching between two different phases, for example between an amorphous disorderly phase and a crystalline or polycrystalline orderly phase. The two phases may be associated with resistivities of significantly different values. Presently, typical phase change materials are chalcogenides, although other materials may be developed. With chalcogenides, the resistivity may vary by two or more orders of magnitude when the material passes between the amorphous (more resistive) phase and the crystalline (more conductive) phase. Phase change can be obtained by locally increasing the temperature of the chalcogenide. Below 150° C., both phases are stable. Starting from an amorphous state and rising to temperature above about 400° C., a rapid nucleation of crystallites may occur and, if the material is kept at the crystallization temperature for a sufficient time, it undergoes a phase change to become crystalline. Reversion to the amorphous state can result by raising the temperature above the melting temperature (about 600° C.) followed by cooling.

Other reversibly programmable materials for memory cells exist and undoubtedly will be developed.

DETAILED DESCRIPTION OF EXAMPLE EMBODIMENTS

Figure 1:
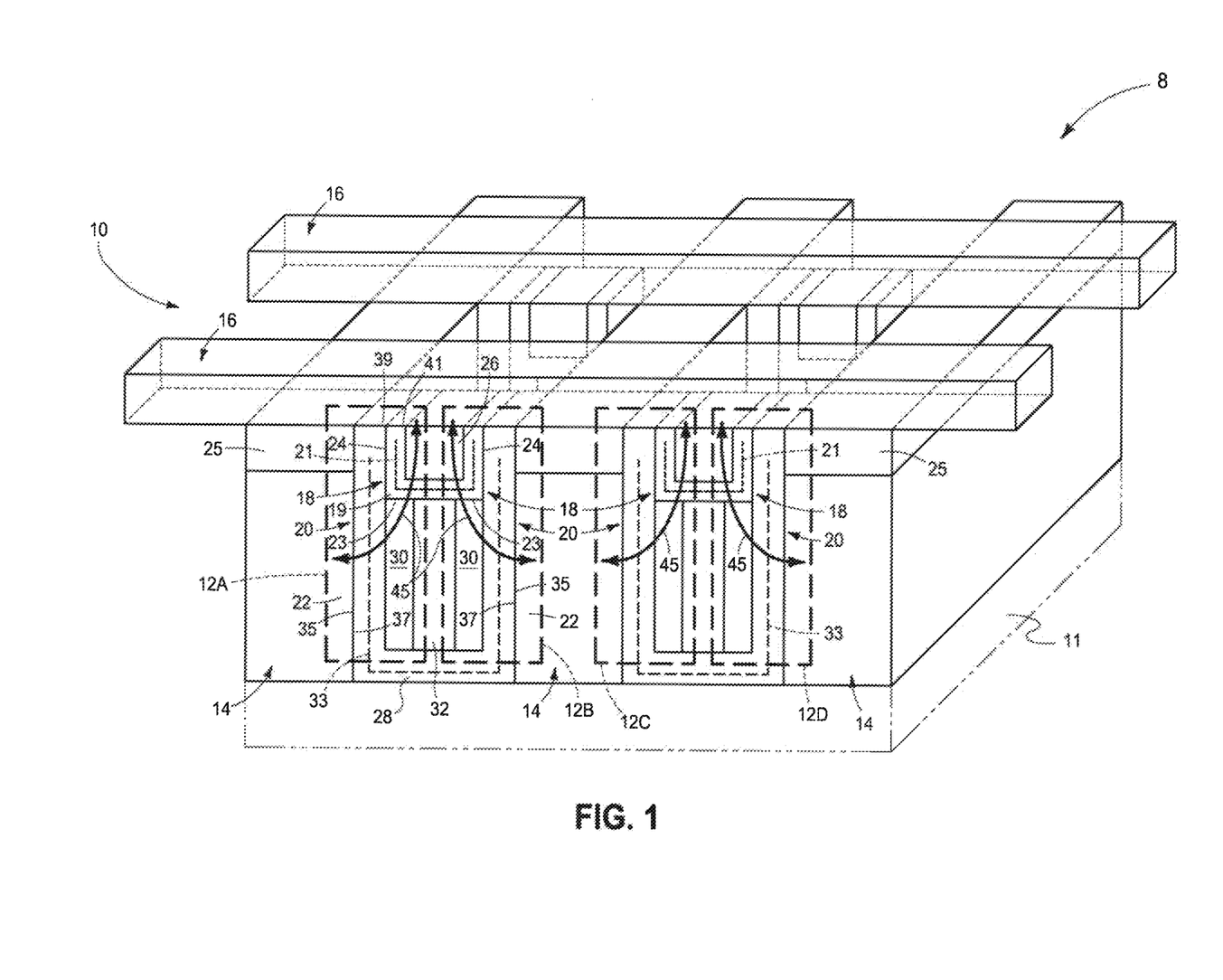
FIG. 1 is a diagrammatic perspective view of a substrate fragment comprising a portion of an array of cross point memory cells in accordance with an embodiment of the invention.

Embodiments of the invention encompass an array of cross point memory cells and methods of forming an array of cross point memory cells. FIG. 1 shows a small portion of a substrate construction 8 comprising an array 10 of individual cross point memory cells that has been fabricated relative to a base substrate 11. Substrate 11 may comprise any one or more of conductive (i.e., electrically herein), semiconductive, or insulative/insulator (i.e., electrically herein) materials. Various materials have been formed elevationally over base substrate 11. In this document, "elevational", "upper", "lower", "top", "bottom", "above", "below", "under", and "beneath" are generally with reference to the vertical direction. "Horizontal" refers to a general direction along a primary surface relative to which the substrate is processed during fabrication, and vertical is a direction generally orthogonal thereto. Further, "vertical" and "horizontal" as used herein are generally perpendicular directions relative one another and independent of orientation of the substrate in three-dimensional space.

Materials may be aside, elevationally inward, or elevationally outward of the FIG. 1—depicted materials. For example, other partially or wholly fabricated components of integrated circuitry may be provided somewhere above, about, or within fragment 11. Control and/or other peripheral circuitry for operating components within the memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array. Regardless, any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

FIG. 1 shows four example memory cell outlines 12A, 12B, 12C, and 12D (also referred to as memory cells 12 collectively and as individual memory cell[s] 12). Array 10 comprises spaced lower first lines 14 and spaced upper second lines 16 which cross first lines 14, with individual memory cells 12 being between first lines 14 and second lines 16 where such cross. Reference to "first" and "second" with respect to different components herein is only for convenience in description in referring to different components. Accordingly, unless otherwise indicated, "first" and "second" may be interchanged independent of relative position within the finished circuit construction and independent of sequence in fabrication. Lines 14 and 16 comprise conductive material, with examples being elemental metals, a mixture or alloy of two or more elemental metals, conductive metal compounds, and conductively-doped semiconductive materials. Lines 14 and 16 may be of the same composition or of different compositions relative one another. In one embodiment, first lines 14 and second lines 16 angle orthogonally relative one another. In one embodiment, lines 14 are access or word lines and lines 16 are sense or bit lines. Dielectric material would be between individual memory cells alongside first lines 14, but is not shown in the figures for clarity.

Individual memory cells 12 comprise a select device 18 and a programmable device 20 in series (i.e., electrical) with each other. Example current flow paths 45 for individual memory cells relative to first lines 14 and second lines 16 through select device 18 and programmable device 20 are shown by way of example. First lines 14 and second lines 16 are elevationally otherwise separated by intervening insulator material 25 (e.g., silicon dioxide and/or silicon nitride).

Any existing or yet-to-be developed select devices may be used, for example a junction device or a diode. Example diodes include PN diodes, PIN diodes, Schottky diodes, Zener diodes, avalanche diodes, tunnel diodes, diodes having more than three materials, metal-semiconductor-metal based tunnel diodes, threshold switches, chalcogenide based threshold switches, etc. Select device 18 is electrically coupled to one of second lines 16. Programmable device 20 is electrically coupled to select device 18 and one of first lines 14. In one embodiment, select device 18 is directly electrically coupled to the one second line and in one embodiment programmable device 20 is directly electrically coupled to both the one first line 14 and select device 18. In this document, two electronic devices or components are "electrically coupled" to one another if in normal operation electric current is capable of continuously flowing from one to the other, and does so predominately by movement of subatomic positive and/or negative charges when such are sufficiently generated. Another electronic component may be between and electrically coupled to the two electrically coupled electronic components or devices. In contrast, when two electronic components or devices are referred to as being "directly electrically coupled", no intervening electronic component is between the two directly electrically coupled components or devices.

Individual programmable devices 20 comprise a first electrode 22 electrically coupled with (in one embodiment and as shown also comprising a portion of) one of first lines 14. A programmable material 28 is laterally aside first electrode 22 and the one first line 14. Any existing or yet-to-be-developed programmable material may be used, for example those described in the "Background" section above. In one embodiment, programmable device 20 is a ferroelectric capacitor with programmable material 28 thereby comprising ferroelectric material. Programmable device 20 also includes a second electrode 30 laterally aside programmable material 28 (in one embodiment directly there-against) and electrically coupled to select device 18. Any suitable conductive material(s) may be used for either first or second electrodes 22 and 30, with TiN being one example. In one embodiment and as shown, first electrode 22 is part of the one first line 14 wherein no portion thereof projects laterally relative to the one first line 14.

In one embodiment, select device 18 comprises an upwardly opening generally U-shape 21 of select device material 19 in a vertical cross-section along its overlying second line (e.g., along the front-depicted second line 16 in FIG. 1). In the context of this document, a "U-shape" has two stems extending upwardly from a generally horizontally (i.e., within 10° of horizontal) interconnecting base, with such stems being at least 75° from horizontal. In one embodiment and as shown, select device material 19 is not generally U-shaped in any vertical cross-section parallel its immediately adjacent first lines 14. In one embodiment, individual ones of the generally U-shaped select device material 19 are shared by two different memory cells along the overlying second line 16. For example as shown, select device material 19 of U-shape 21 between the two left-illustrated first lines 14 is shared by different immediately adjacent memory cells 12A and 12B. Select device material 19 of the generally U-shape 21 between the two far right-illustrated first lines 14 is shared by different immediately adjacent memory cells 12C and 12D. In one such embodiment, individual ones of generally U-shaped select device material 19 may be considered as comprising laterally outer sidewalls 24 which are aside and directly against programmable material 28 of such two immediately adjacent memory cells. Regardless, in one embodiment, a shared electrode 26 is within individual ones of generally U-shaped select device material 19 and that is electrically coupled with the overlying second line 16 and shared by such two immediately adjacent memory cells.

In one embodiment, programmable material 28 is laterally between one first line 14 and a first line 14 immediately adjacent thereto. In one embodiment, programmable material 28 comprises an upwardly open generally U-shape 33 in the vertical cross-section along its overlying second line 16. Individual ones of select device material 19 of generally U-shape 21 are laterally within individual ones of programmable material 28 of generally U-shape 33. In one embodiment, individual ones of generally U-shaped programmable material 28 contain two physically separated second electrodes 30 of two different programmable devices 20 of immediately adjacent memory cells 12 along the overlying second line 16. Insulator material 32 (e.g., silicon dioxide and/or silicon nitride) is shown laterally between second electrodes 30.

In one embodiment, programmable material 28 is not generally U-shaped in any vertical cross-section parallel its laterally aside one first line 14. In one embodiment, programmable material 28 is discontinuous between individual memory cells along the one and immediately adjacent first lines. In one embodiment, the generally U-shaped programmable material 28 has external sidewalls 35 that are directly against longitudinally elongated sidewalls 37 of the one and immediately adjacent first lines 14. In one embodiment, programmable material 28 and select device 18 have respective elevationally outermost tops 39 and 41, respectively, that are planar and in one embodiment that are elevationally coincident. In one embodiment, second electrode 30 is directly against an elevationally innermost surface 23 of generally U-shaped select device material 19 in the vertical cross-section along its overlying second line 16.

Figure 2:
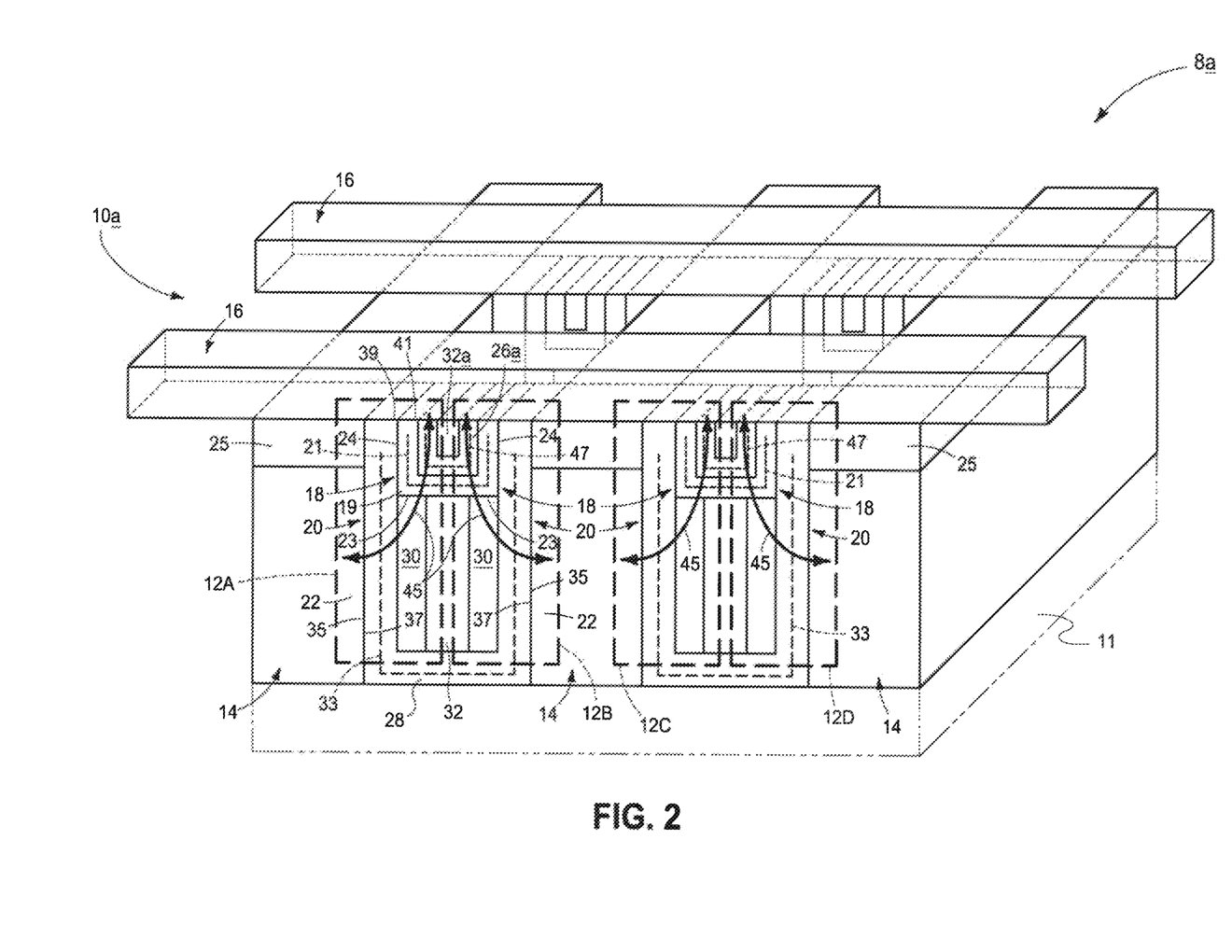
FIG. 2 is a diagrammatic perspective view of a substrate fragment comprising a portion of an array of cross point memory cells in accordance with an embodiment of the invention.

FIG. 1 depicts an example embodiment wherein shared electrode 26 does not comprise an upwardly open generally U-shape in the vertical cross-section. FIG. 2 shows an example alternate embodiment construction 8a of an array 10a. Like numerals from the above-described embodiments have been used where appropriate, with some construction differences being indicated with the suffix "a". In the FIG. 2 example, shared electrode 26a comprises an upwardly open generally U-shape 47 in vertical cross-section along its overlying second line 16. Insulator material 32a internally fills U-shape 47. Any other attribute(s) or aspect(s) as described above and below, and shown in any Figure, may be used in the FIG. 2 embodiments.

Figure 3:
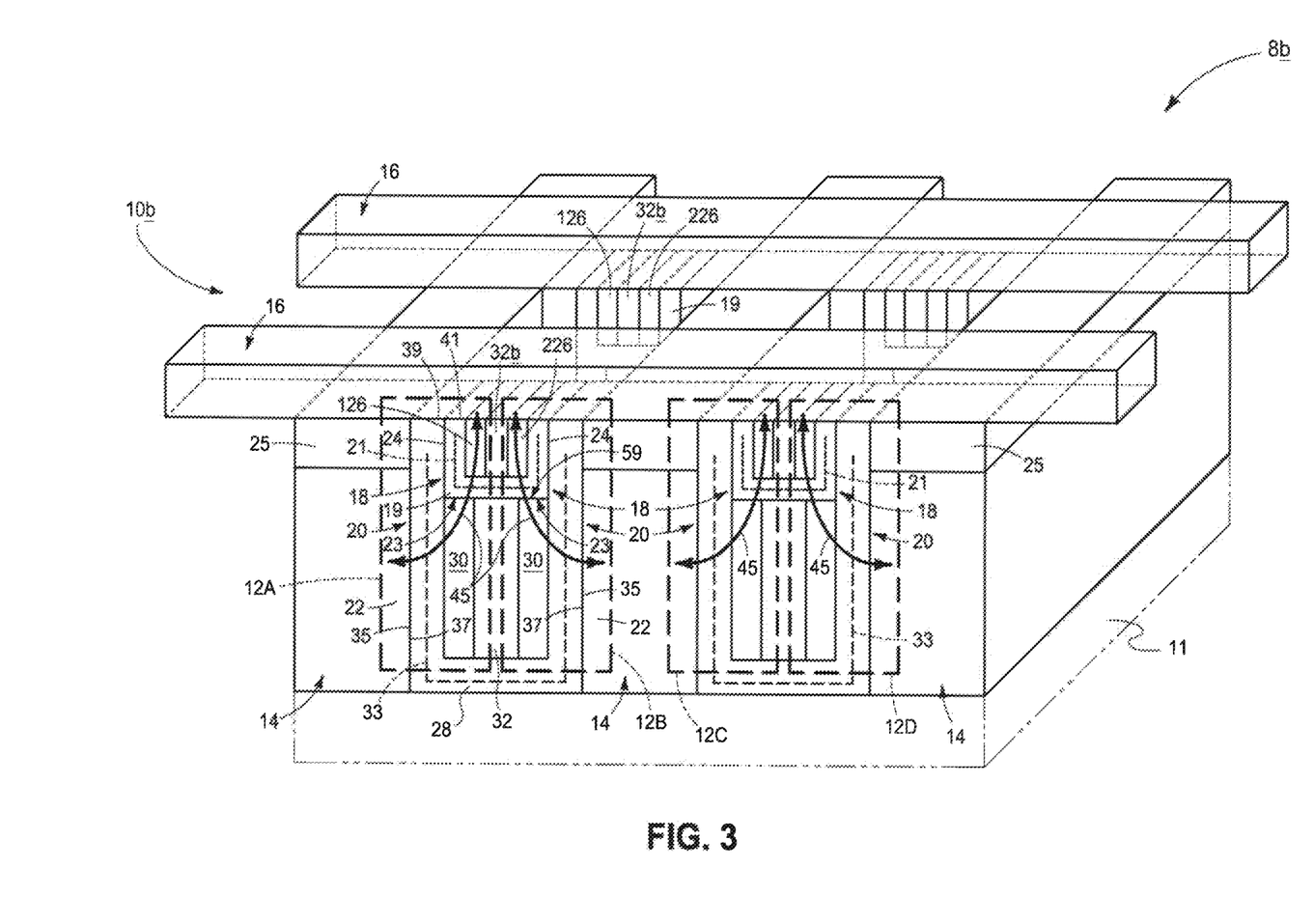
FIG. 3 is a diagrammatic perspective view of a substrate fragment comprising a portion of an array of cross point memory cells in accordance with an embodiment of the invention.

FIG. 3 shows an example alternate embodiment construction 8b of an array 10b. Like numerals from the above-described embodiments have been used where appropriate, with some construction differences being indicated with the suffix "b" or with different numerals. In array 10b, individual ones of generally U-shaped select device material 19 contain two non-shared electrodes 126 and 226 that are electrically coupled with the overlying second line 16, and are accordingly not individually shared by two immediately adjacent memory cells. Any other attribute(s) or aspect(s) as described above and below, and shown in any Figure, may be used in the FIG. 3 embodiments.

Figure 4:
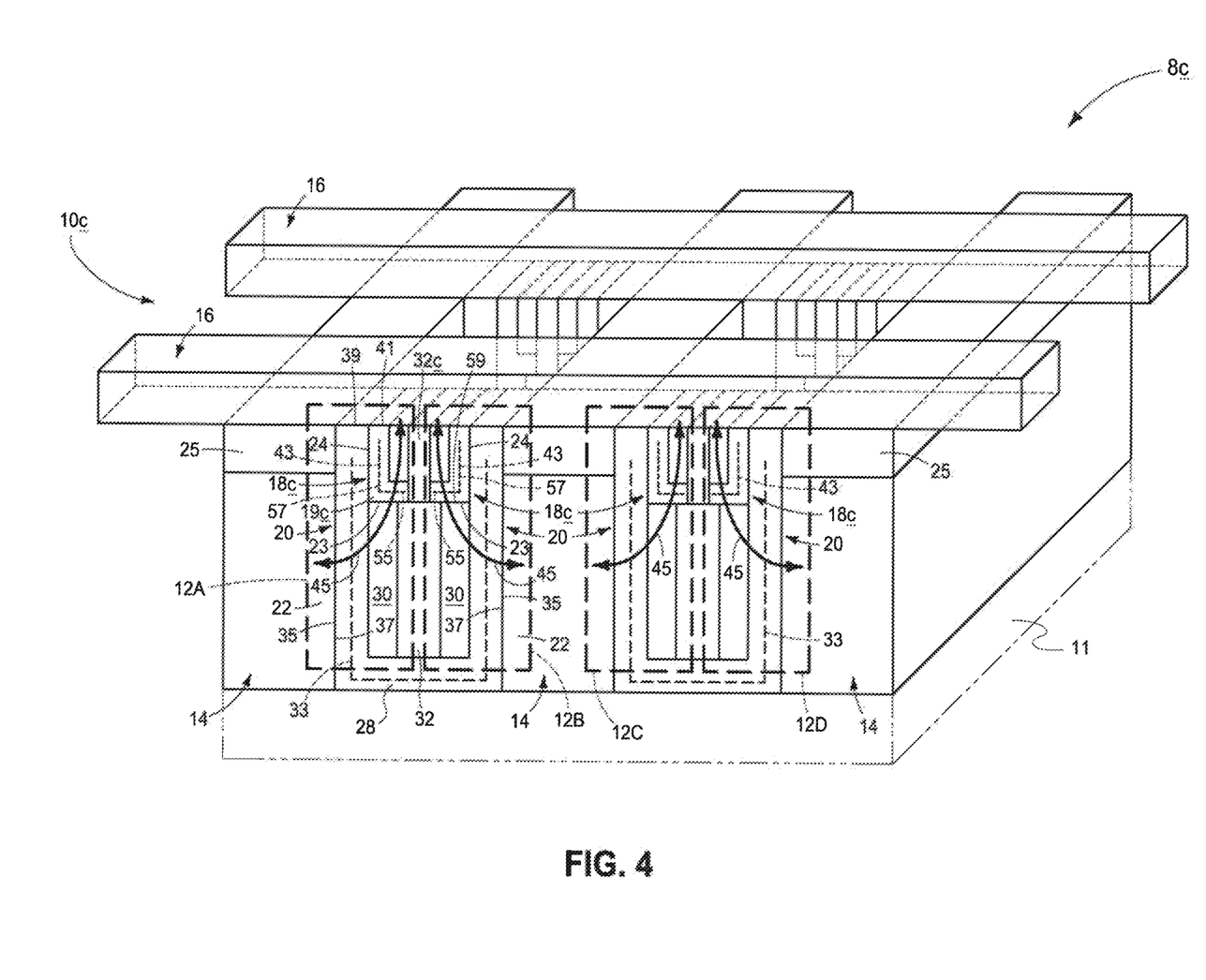
FIG. 4 is a diagrammatic perspective view of a substrate fragment comprising a portion of an array of cross point memory cells in accordance with an embodiment of the invention.
Figure 5:
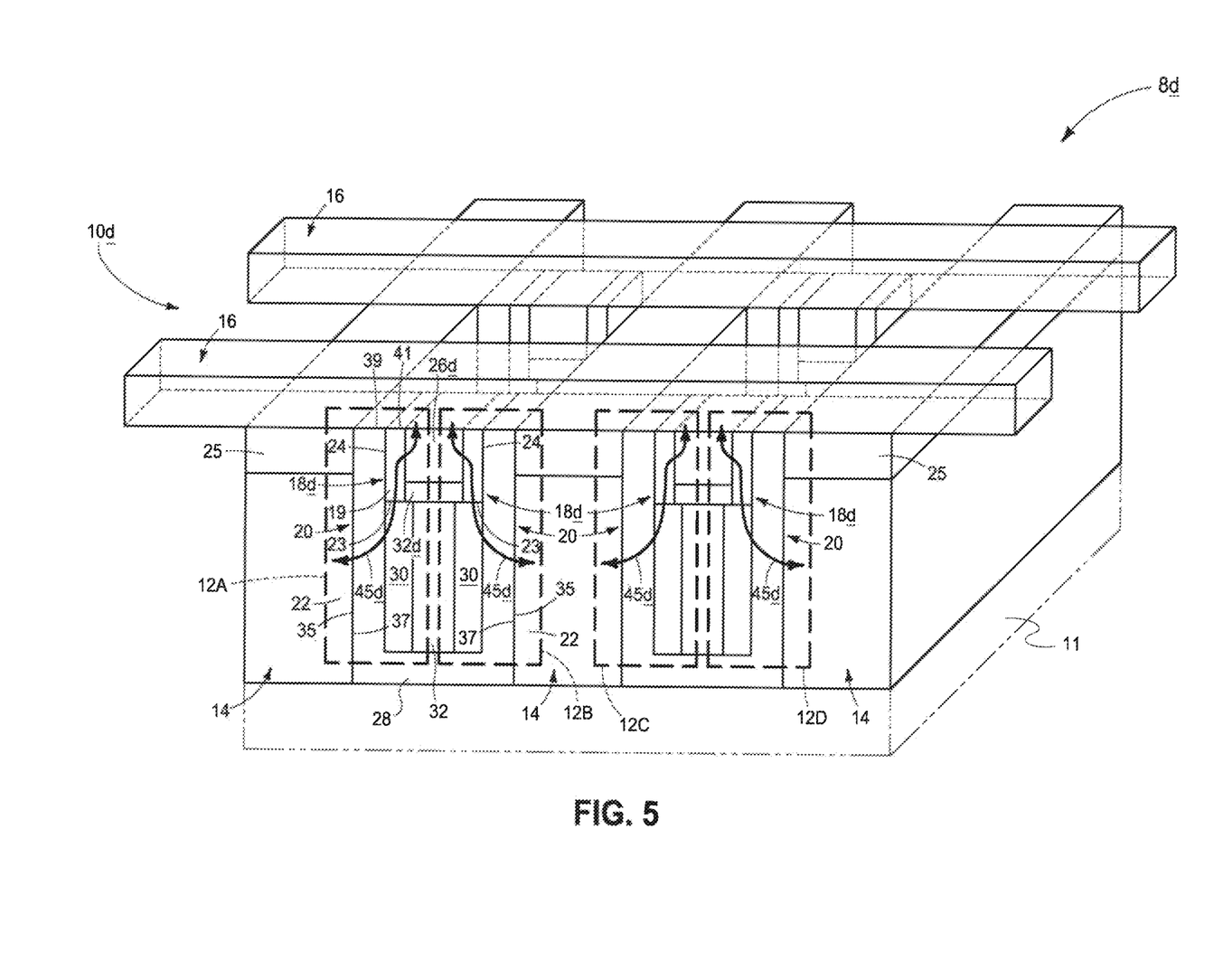
FIG. 5 is a diagrammatic perspective view of a substrate fragment comprising a portion of an array of cross point memory cells in accordance with an embodiment of the invention.

FIG. 4 shows an example alternate embodiment construction 8c of an array 10c. Like numerals from the above-described embodiments have been used where appropriate, with some construction differences being indicated with the suffix "c" or with different numerals. In FIG. 4, select device 18c does not comprise an upwardly open generally U-shape of select device material, but rather comprises a generally L-shape 43 of select device material 19 in vertical cross-section along its overlying second line 16. In the context of this document, an "L-shape" has only a single stem extending upwardly from a generally horizontal (i.e., within 10° of horizontal) base, with such stem being at least 75° from horizontal, and regardless of whether the generally horizontal base extends laterally to the left or right relative to the stem. In one embodiment and as shown, a base 55 of L-shape 43 extends laterally from a stem 57 of L-shape 43 laterally away from the one first line 14 of the individual memory cell 12. In one embodiment and as shown, immediately adjacent select devices 18c between immediately adjacent first lines 14 are mirror image in the vertical cross-section along the overlying second line 16. In one embodiment and as shown, an elevationally innermost surface 23 of select device material 19c of L-shape 43 is directly against an elevationally outermost surface 59 of second electrode 30. Any other attribute(s) or aspect(s) as described above and below, and shown in any Figure, may be used in the FIG. 4 embodiments FIG. 5 shows an example alternate embodiment construction 8d of an array 10d. Like numerals from the above-described embodiments have been used where appropriate, with some construction differences being indicated with the suffix "d". In array 10d, select device 18d does not comprise any upwardly opening U-shape of select device material 19d in the vertical cross-section along its overlying second line, and in one such embodiment comprises a shared electrode 26d that is electrically coupled with the overlying second line 16 and is shared by two immediately adjacent memory cells. Any other attribute(s) or aspect(s) as described above and below, and shown in any Figure, may be used in the FIG. 5 embodiments.

Figure 6:
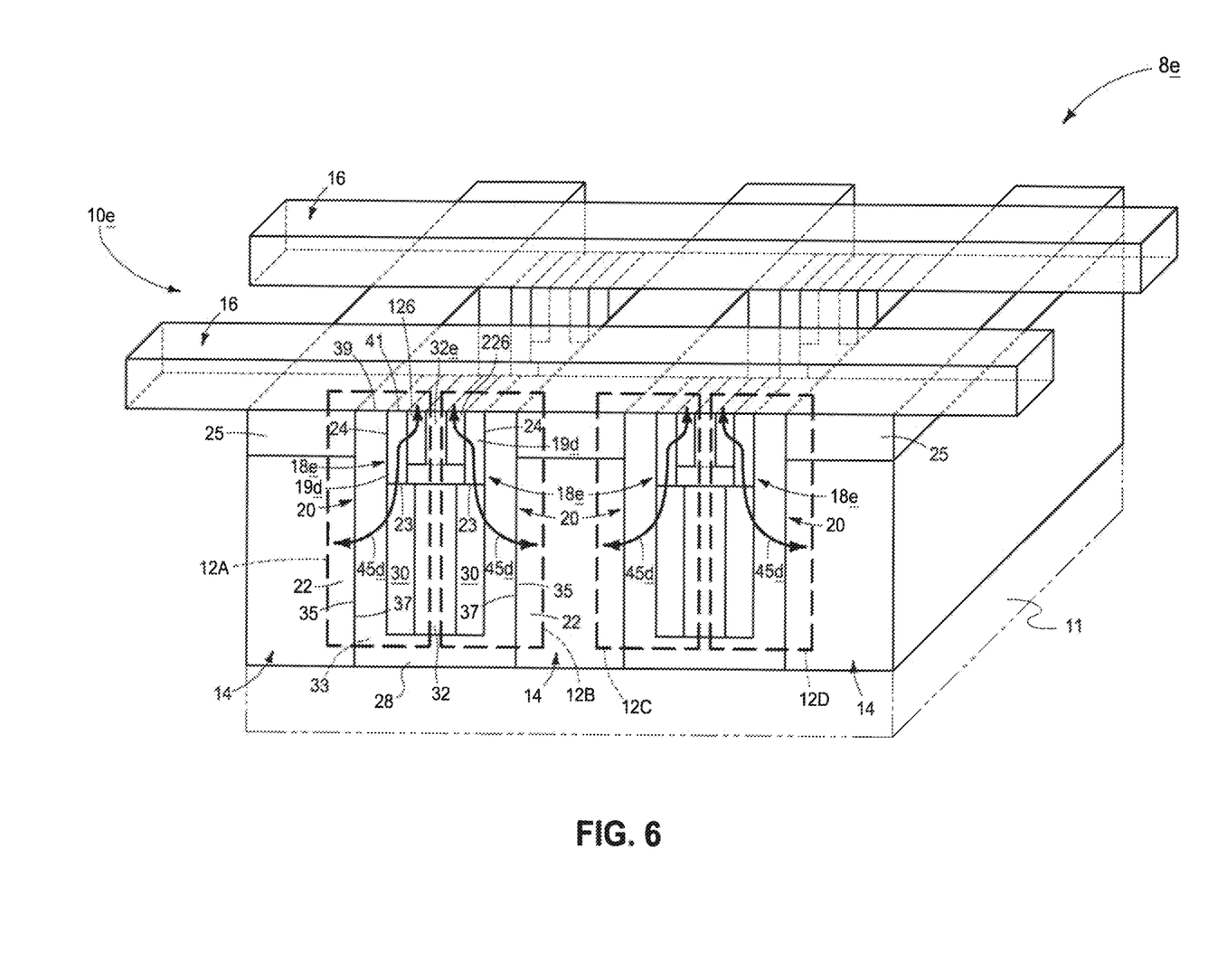
FIG. 6 is a diagrammatic perspective view of a substrate fragment comprising a portion of an array of cross point memory cells in accordance with an embodiment of the invention.

FIG. 6 shows an example alternate embodiment construction 8e of an array 10e. Like numerals from the above-described embodiments have been used where appropriate, with some construction differences being indicated with the suffix "e". In array 10e, select device 18e does not comprise any upwardly opening U-shape of select device material 19d in the vertical cross-section along its overlying second line, and in one such embodiment contains two physically separated second electrodes 126, 226 of two different programmable devices of immediately adjacent memory cells along the overlying second line 16. Any other attribute(s) or aspect(s) as described above and below, and shown in any Figure, may be used in the FIG. 6 embodiments.

Embodiments of the invention encompass methods of forming an array of cross point memory cells and example embodiments of which are next described with reference to FIGS. 7-13. Like numerals from the above-described embodiments for like materials of construction have been used where appropriate, with some construction differences being indicated with different numerals. FIGS. 7-13 show an example embodiment for fabrication of the FIG. 1 array from a predecessor construction 8. Any of the depicted patternings herein may use masking steps, for example photolithographic or other patterning masks and, regardless, which may use pitch multiplication.

A method of forming an array of cross-point memory cells in accordance with an embodiment of the invention comprises using two, and only two, masking steps to collectively pattern within the array spaced lower first lines, spaced upper second lines which cross the first lines, and individual programmable devices between the first lines and the second lines where such cross and that have an upwardly open generally U-shape vertical cross-section of programmable material laterally between immediately adjacent of the first lines beneath individual of the upper second lines. In one embodiment, select device material is between the programmable devices and the upper second lines and the two masking steps are used to also pattern the select device material. In one embodiment, a last of the two masking steps collectively final patterns material of each of the second lines and the individual programmable devices within the array.

Figure 7:
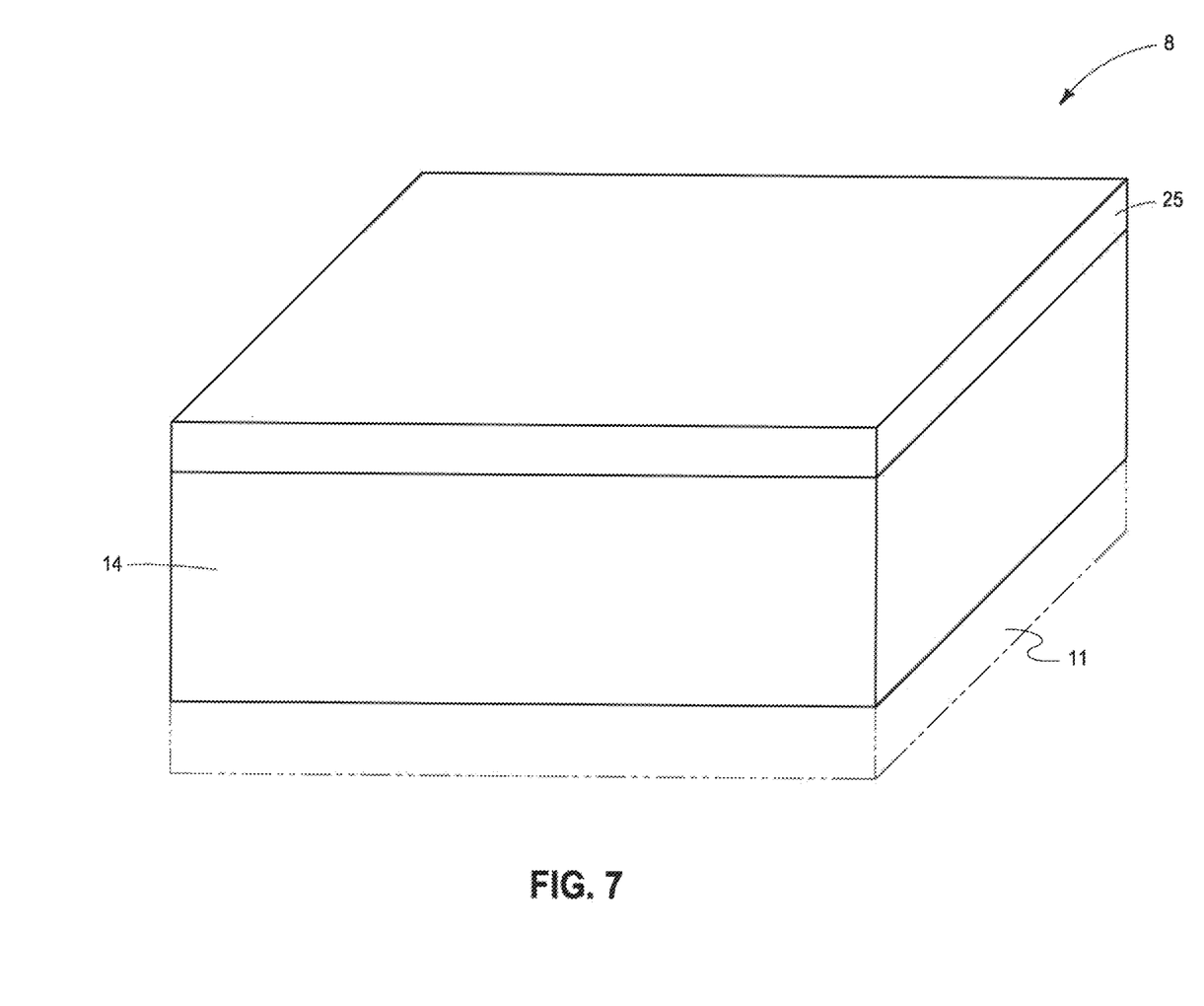
FIG. 7 is a diagrammatic perspective view of a predecessor substrate to that of FIG. 1 in process in accordance with an embodiment of the invention.

Referring to FIG. 7, conductive material 14 from which the spaced lower lines will be fabricated and insulator material 25 have been formed over base substrate 11.

Figure 8:
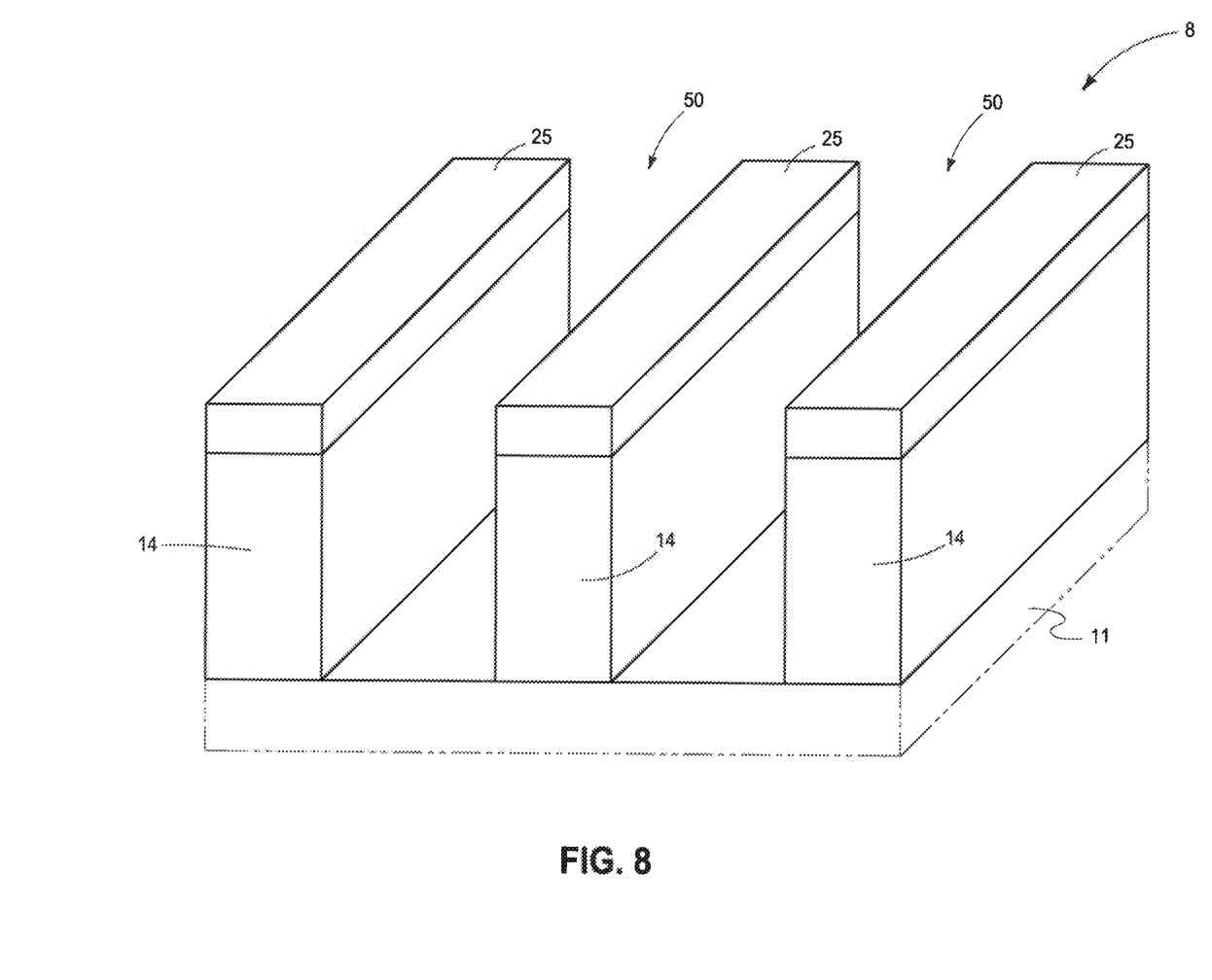
FIG. 8 is a view of the FIG. 7 substrate at a processing step subsequent to that shown by FIG. 7.

Referring to FIG. 8, a first of the two masking steps has been used to pattern first lines 14 and form trenches 50 there-between. By way of example, such a masking step may include photolithographic patterning and etch using photoresist (not shown), hard-mask layers (not shown), and/or anti-reflective coatings (not shown) atop insulator material 25 to have the same general outline as lines 14, followed by removal of such materials from being over insulator material 25. However, any other existing or yet-to-be-developed masking step may be used to produce a construction as shown in FIG. 8.

Figure 9:
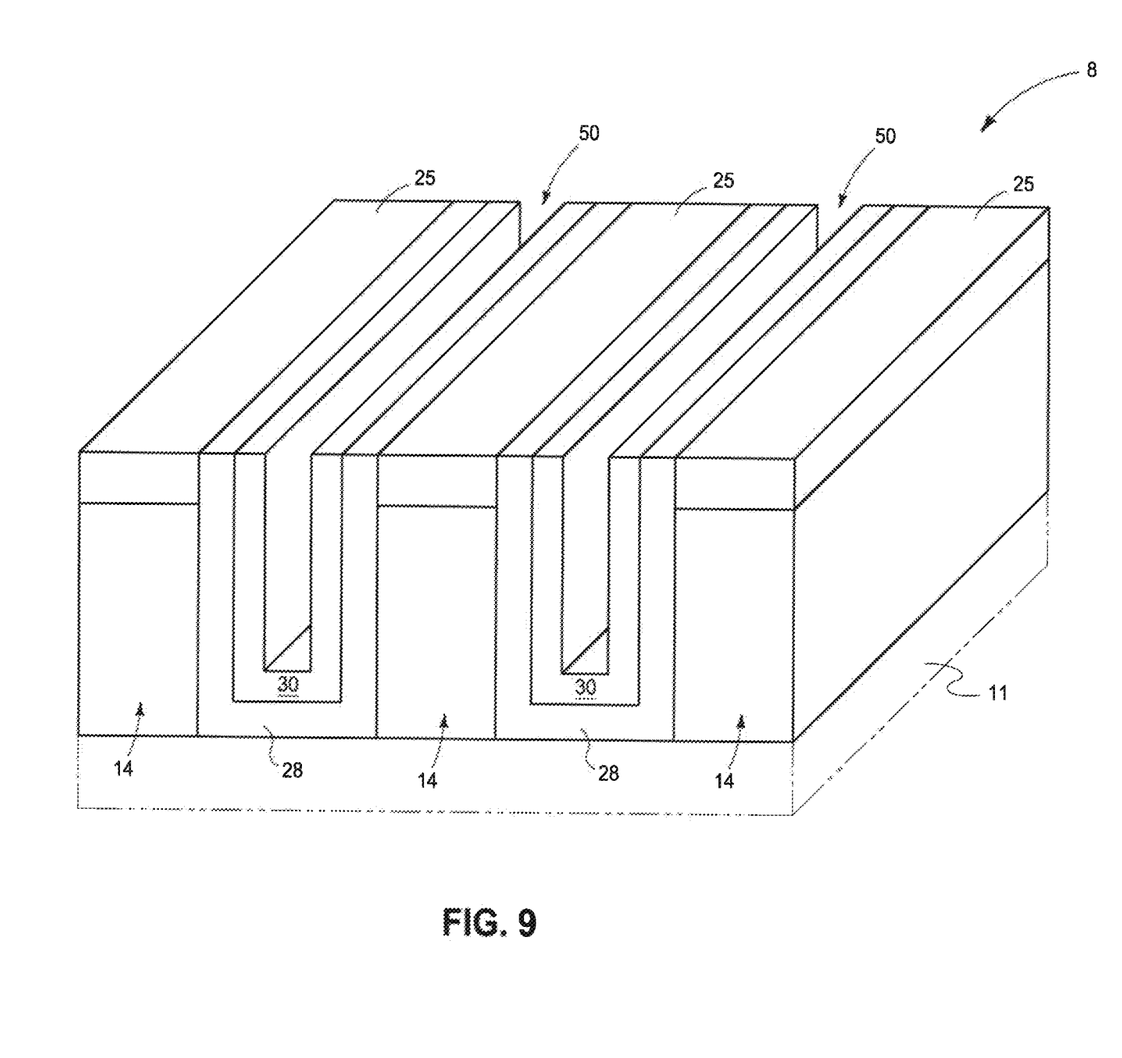
FIG. 9 is a view of the FIG. 8 substrate at a processing step subsequent to that shown by FIG. 8.
Figure 10:
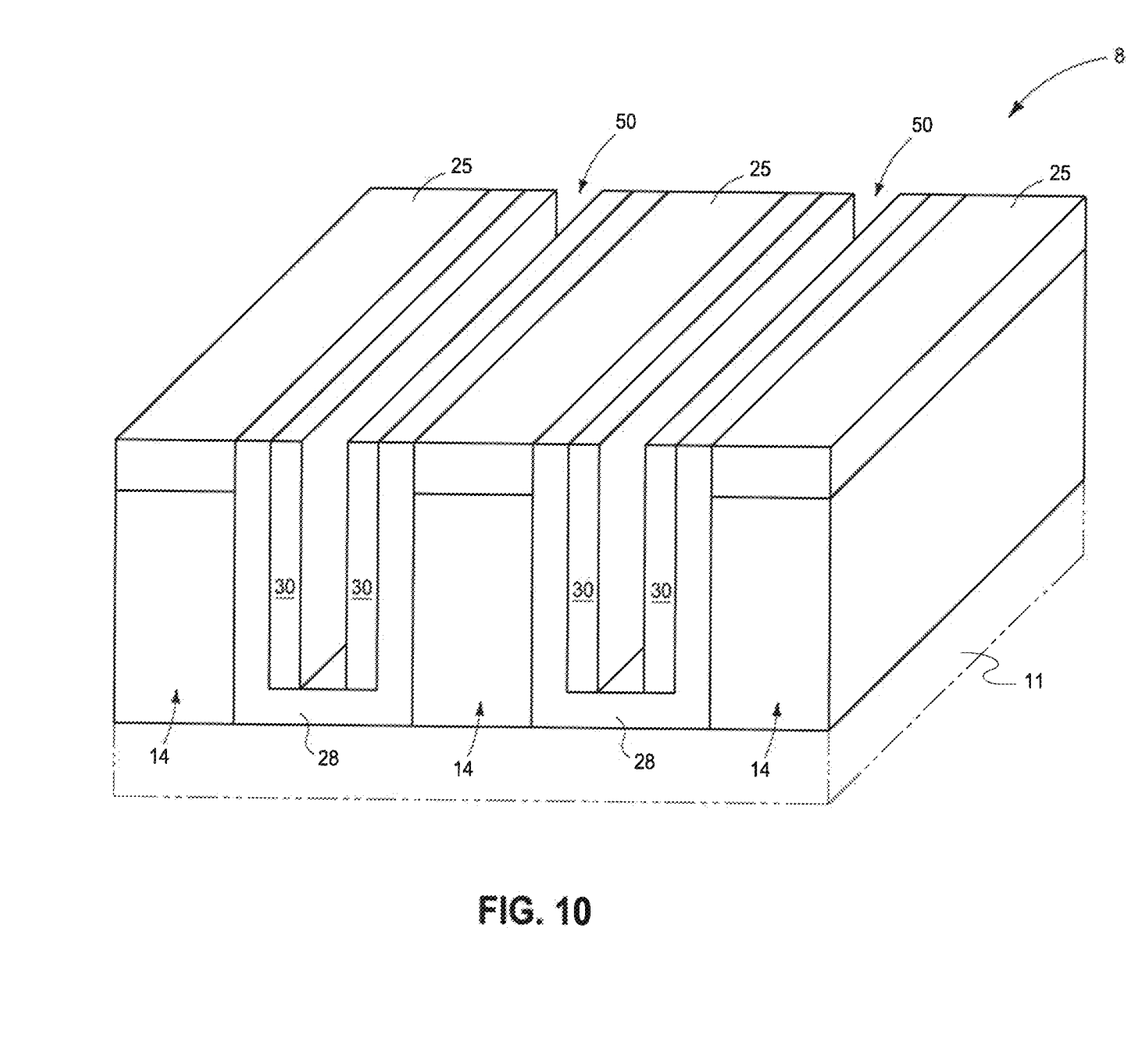
FIG. 10 is a view of the FIG. 9 substrate at a processing step subsequent to that shown by FIG. 9.

In one embodiment, programmable material of the programmable devices is formed longitudinally alongside the first lines within the trenches. In one such embodiment, conductive electrode material of the programmable devices is formed longitudinally along the programmable material. As examples, FIG. 9 shows trenches 50 having been lined with programmable material 28 of the programmable devices to be formed to less-than-fill trenches 50. The programmable material-lined trenches 50 have then been lined with conductive electrode material 30 of the programmable devices to be formed to less-than-fill the programmable material-lined trenches. FIG. 10 shows conductive electrode material 30 having then been anisotropically etched selectively relatively to programmable material 28 and insulator material 25 to form spaced walls 30 of conductive electrode material 30 and expose programmable material 28 there-between (e.g., at the bottom of the conductive electrode material-lined trenches 50).

Figure 11:
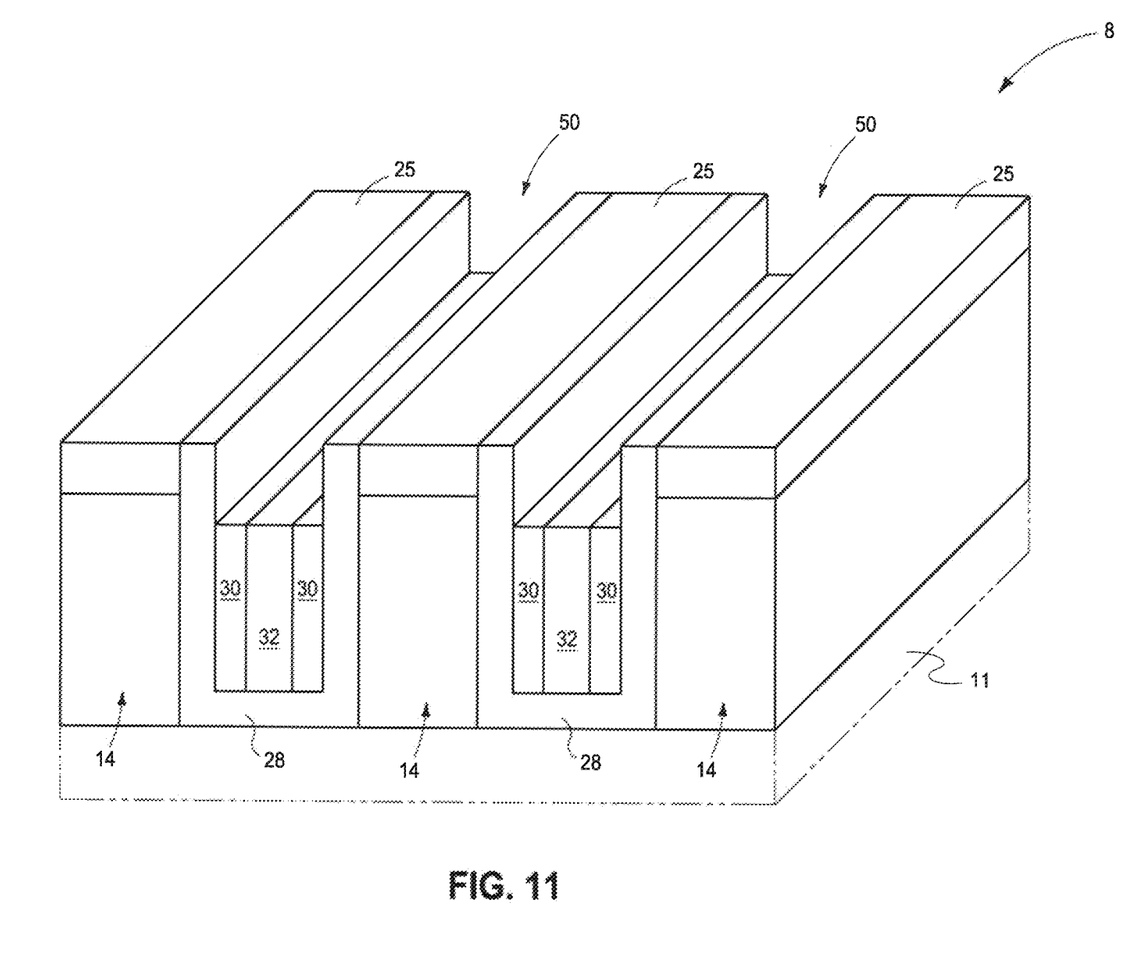
FIG. 11 is a view of the FIG. 10 substrate at a processing step subsequent to that shown by FIG. 10.

Referring to FIG. 11, insulator material 32 has been deposited to fill remaining volume trenches 50. Then, spaced conductive electrode material walls 30 have been recessed relative to programmable material 28, as has been insulator material 32.

Figure 12:
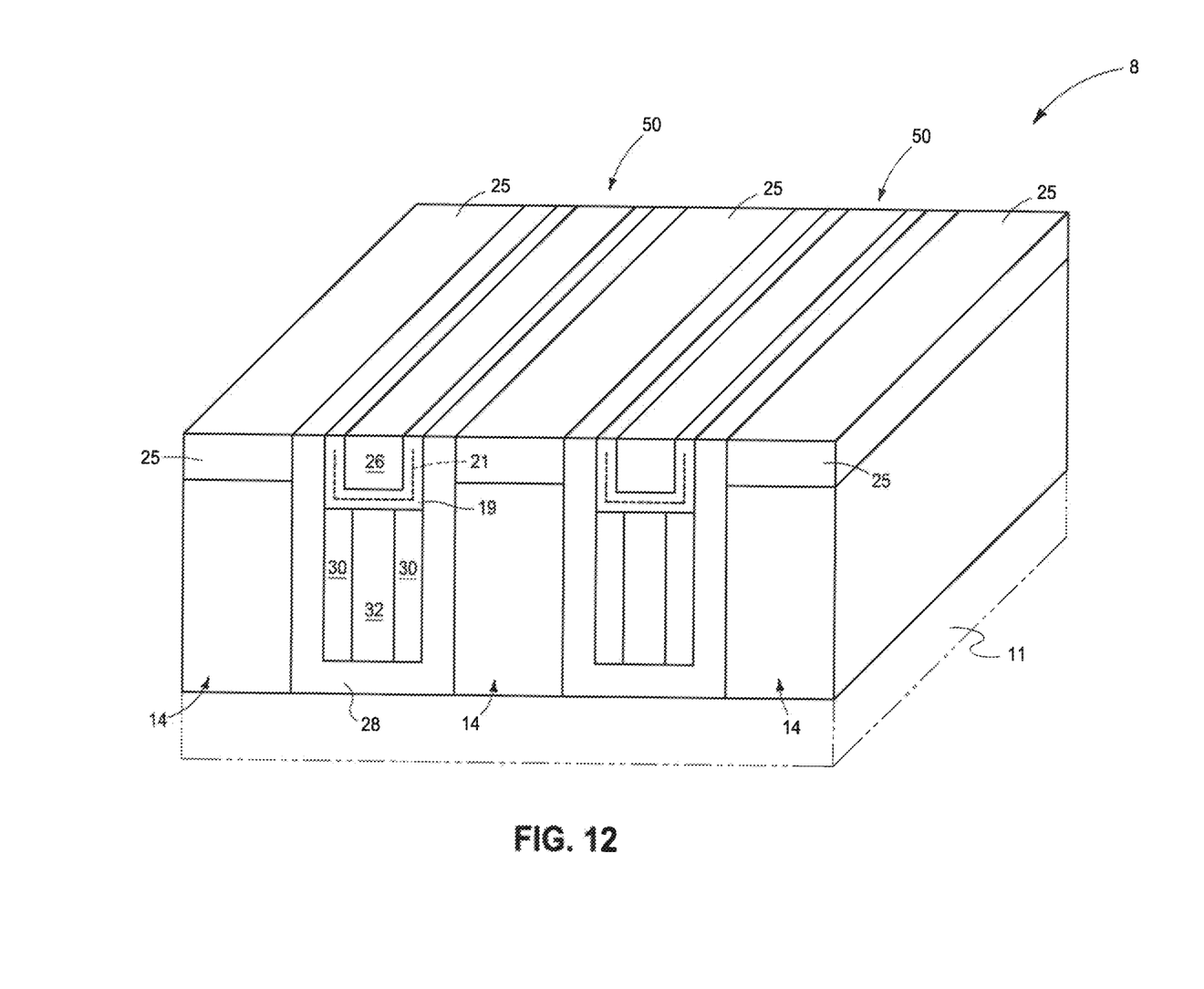
FIG. 12 is a view of the FIG. 11 substrate at a processing step subsequent to that shown by FIG. 11.

Referring to FIG. 12, select device material 19 of individual of the memory cells has been formed within the recesses that were formed by the act of elevationally recessing in FIG. 11. Select device material 19 comprises upwardly open generally U-shape 21 in vertical cross-section orthogonal to first lines 14. Accordingly and in one embodiment, uppermost portions of the programmable material-lined trenches have been lined with select device material to less-than-fill the uppermost portions of the programmable material-lined trenches. Conductive material 26 has then been deposited within the generally U-shape 21 of select device material 19, followed by planarizing materials 19 and 26 back at least to the elevationally outermost surfaces of insulator material 25.

Figure 13:
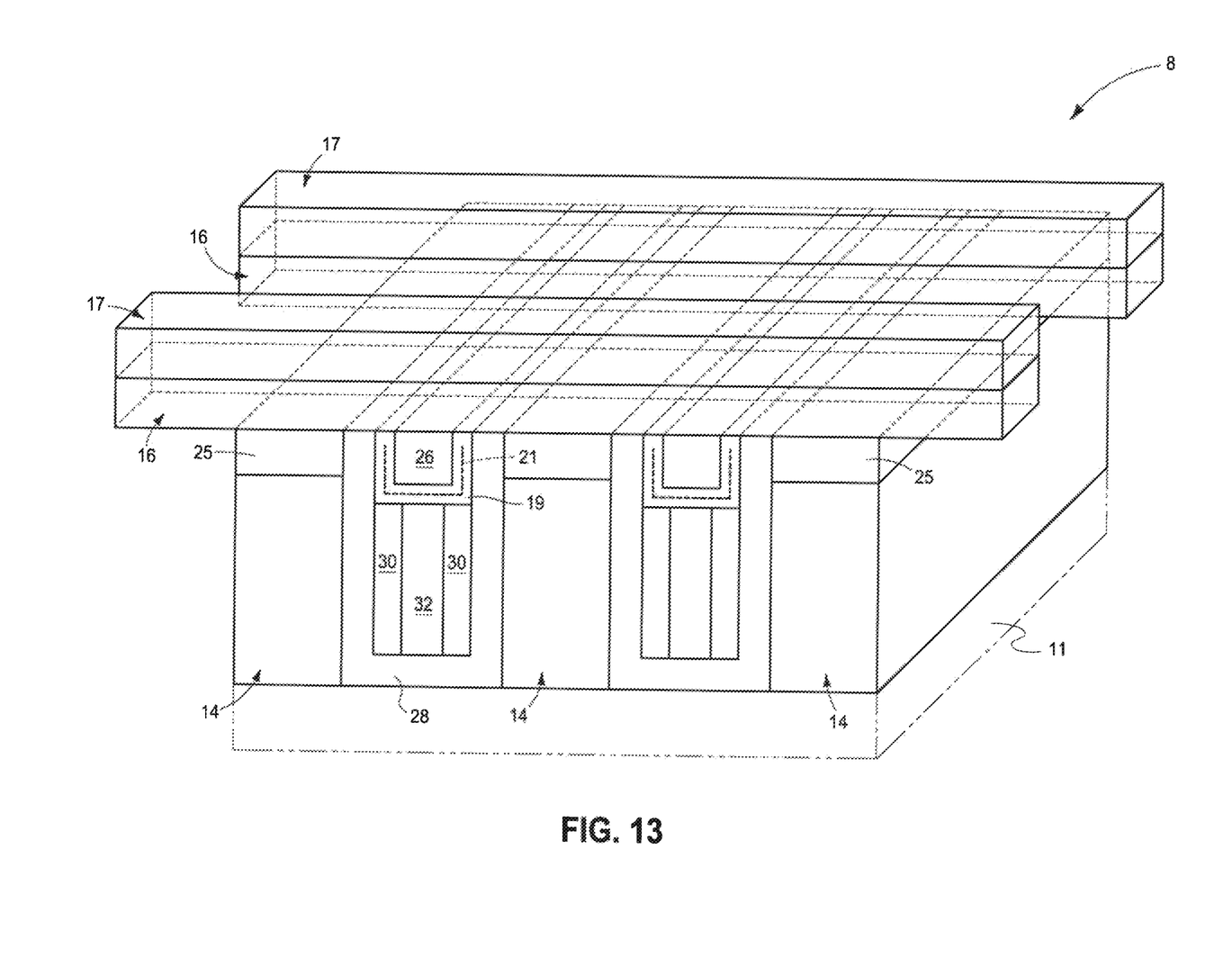
FIG. 13 is a view of the FIG. 12 substrate at a processing step subsequent to that shown by FIG. 12.

Referring to FIG. 13, conductive material of upper second lines 16 and an example masking material 17 has been deposited over the substrate of FIG. 12. Then, masking material 17 has been patterned and used as a mask while anisotropically etching conductive material 16 at least to elevationally outermost surfaces of insulator material 32, programmable material 28, select device material 19, and conductive electrode material 26. Subsequent selective anisotropic etching can then be conducted of materials 32, 28, 19, and 26 relative to insulator material 25 and masking material 17 to produce the example construction as shown in FIG. 1. Accordingly, processing shown and just-described with respect to FIGS. 13 and 1 constitutes an example second of the two masking steps.

As alternate example method embodiments, the select device material-lined trenches may be lined with conductive electrode material 26 to less-than-fill the select device material-lined trenches, for example to produce the generally upwardly open U-shape 47 as shown with respect to conductive electrode material 26a in FIG. 2. Further if desired, conductive electrode material 26a as shown in FIG. 2 and prior to deposition of material 32a may be anisotropically etched to select device material 19 to form spaced walls 126 and 226 (FIG. 3) of conductive electrode material and expose select device material 19 there-between. Such etching may be conducted selectively relative to the select device material and whereby etching is not conducted completely there-through prior to depositing material of the upper second lines, for example to produce a construction as shown in FIG. 3. Alternately, etching may ultimately be completely etched through select device material 19 using spaced walls 126 and 226 as a mask prior to depositing material of the upper second lines, for example to ultimately produce an example construction as shown in FIG. 4.

CONCLUSION

In some embodiments, a method of forming an array of cross point memory cells comprises using two, and only two, masking steps to collectively pattern within the array spaced lower first lines, spaced upper second lines which cross the first lines, and individual programmable devices between the first lines and the second lines where such cross that have an upwardly open generally U-shape vertical cross-section of programmable material laterally between immediately adjacent of the first lines beneath individual of the upper second lines.

In some embodiments, an array of cross point memory cells comprises spaced lower first lines, spaced upper second lines which cross the first lines, and an individual memory cell between the first lines and the second lines where such cross. The individual memory cells comprise a select device and a programmable device in series with each other. The select device is electrically coupled to one of the second lines. The programmable device is electrically coupled to the select device and one of the first lines. The select device comprises an upwardly open generally U-shape of select device material in a vertical cross-section along its overlying second line. The programmable device comprises a first electrode electrically coupled to one of the first lines, programmable material laterally aside the first electrode and the one first line, and a second electrode laterally aside the programmable material and electrically coupled to the select device.

In some embodiments, an array of cross point memory cells comprises spaced lower first lines, spaced upper second lines which cross the first lines, and an individual memory cell between the first lines and the second lines where such cross. The individual memory cells comprise a select device and a programmable device in series with each other. The select device is electrically coupled to one of the second lines. The programmable device is electrically coupled to the select device and one of the first lines. The programmable device comprises a first electrode electrically coupled to one of the first lines, programmable material laterally aside the one first line (the programmable material being laterally between the one first line and a first line immediately adjacent thereto and comprising an upwardly open generally U-shape in a vertical cross-section along its overlying second line), and a second electrode laterally aside the programmable material and electrically coupled to the select device.

In some embodiments, an array of cross point memory cells comprises spaced lower first lines, spaced upper second lines which cross the first lines, and an individual memory cell between the first lines and the second lines where such cross. The individual memory cells comprise a select device and a programmable device in series with each other. The select device is electrically coupled to one of the second lines. The programmable device is electrically coupled to the select device and one of the first lines. The select device comprises a general L-shape of select device material in a vertical cross-section along its overlying second line. The programmable device comprises a first electrode electrically coupled to one of the first lines, programmable material laterally aside the first electrode and the one first line, and a second electrode laterally aside the programmable material and electrically coupled to the select device.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array of cross point memory cells comprising:
    spaced lower first lines, spaced upper second lines which cross the first lines, and an individual memory cell between the first lines and the second lines where such cross, the individual memory cells comprising:
        a select device and a programmable device in series with each other, the select device being electrically coupled to one of the second lines, the programmable device being electrically coupled to the select device and one of the first lines, the select device comprising an upwardly open generally U-shape of select device material in a vertical cross-section along its overlying second line; and
        the programmable device comprising:
            a first electrode electrically coupled to one of the first lines;
            programmable material laterally aside the first electrode and the one first line; and
            a second electrode laterally aside the programmable material and electrically coupled to the select device.

2. The array of claim 1 wherein the first electrode is part of the one first line wherein no portion thereof projects laterally relative to the one first line.

3. The array of claim 1 wherein individual ones of the generally U-shaped select device material are shared by two different immediately adjacent memory cells along said overlying second line.

4. The array of claim 3 wherein laterally outer sidewalls of the individual ones of the generally U-shaped select device material are aside and directly against the programmable material of said two immediately adjacent memory cells.

5. The array of claim 3 comprising a shared electrode within the individual ones of the generally U-shaped select device material that is electrically coupled with said overlying second line and shared by said two immediately adjacent memory cells.

6. The array of claim 5 wherein the shared electrode does not comprise an upwardly open generally U-shape in the vertical cross-section.

7. The array of claim 5 wherein the shared electrode comprises an upwardly open generally U-shape in the vertical cross-section.

8. The array of claim 3 wherein the individual ones of the generally U-shaped select device material contain two non-shared electrodes that are each electrically coupled with said overlying second line.

9. The array of claim 1 wherein the programmable material comprises an upwardly open generally U-shape in the vertical cross-section, individual ones of the generally U-shaped select device material being laterally within individual ones of the generally U-shaped programmable material.

10. The array of claim 1 wherein the second electrode is directly against an elevationally innermost surface of the generally U-shaped select device material in the vertical cross-section.

11. The array of claim 1 wherein the select device material is not generally U-shaped in any vertical cross-section parallel its immediately adjacent first lines.

12. An array of cross point memory cells comprising:
    spaced lower first lines, spaced upper second lines which cross the first lines, and an individual memory cell between the first lines and the second lines where such cross, the individual memory cells comprising:
        a select device and a programmable device in series with each other, the select device being electrically coupled to one of the second lines, the programmable device being electrically coupled to the select device and one of the first lines; and
        the programmable device comprising:
            a first electrode electrically coupled to one of the first lines;
            programmable material laterally aside the first electrode and the one first line, the programmable material being laterally between the one first line and a first line immediately adjacent thereto and comprising an upwardly open generally U-shape in a vertical cross-section along its overlying second line; and
            a second electrode laterally aside the programmable material and electrically coupled to the select device.

* * * * *